United States Patent
Yang et al.

(10) Patent No.: US 11,508,437 B2
(45) Date of Patent: *Nov. 22, 2022

(54) RESTORING MEMORY CELL THRESHOLD VOLTAGES

(71) Applicant: Micron Technology, Inc., Boise, ID (US)

(72) Inventors: Lingming Yang, Meridian, ID (US); Nevil Gajera, Meridian, ID (US); Karthik Sarpatwari, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/196,638

(22) Filed: Mar. 9, 2021

(65) Prior Publication Data

US 2021/0287744 A1 Sep. 16, 2021

Related U.S. Application Data

(63) Continuation of application No. 16/684,526, filed on Nov. 14, 2019, now Pat. No. 10,964,385.

(51) Int. Cl.
*G11C 7/00* (2006.01)
*G11C 13/00* (2006.01)

(52) U.S. Cl.
CPC ........ *G11C 13/004* (2013.01); *G11C 13/0004* (2013.01); *G11C 13/0069* (2013.01); *G11C 2013/0045* (2013.01)

(58) Field of Classification Search
CPC .................................................. G11C 11/406
USPC ....................................................... 365/222
See application file for complete search history.

(56) References Cited

U.S. PATENT DOCUMENTS

| | | | |
|---|---|---|---|
| 5,949,733 A | 9/1999 | Kotani et al. | |
| 10,964,385 B1* | 3/2021 | Yang | G11C 13/0004 |
| 2006/0265548 A1 | 11/2006 | Symanczyk et al. | |
| 2008/0025079 A1 | 1/2008 | Philipp et al. | |
| 2008/0112248 A1 | 5/2008 | Butler | |
| 2012/0063196 A1 | 3/2012 | Kim et al. | |
| 2013/0107648 A1 | 5/2013 | Kajigaya et al. | |
| 2014/0177355 A1 | 6/2014 | Kim | |

(Continued)

FOREIGN PATENT DOCUMENTS

CN 109313920 A 2/2019

OTHER PUBLICATIONS

International Search Report and Written Opinion received for PCT Patent Application No. PCT/US20/57765, dated Feb. 15, 2021, 8 pages.

(Continued)

*Primary Examiner* — Hoai V Ho
(74) *Attorney, Agent, or Firm* — Holland & Hart LLP

(57) ABSTRACT

Methods, systems, and devices for restoring memory cell threshold voltages are described. A memory device may perform a write operation on a memory cell during which a logic state is stored at the memory cell. Upon detecting satisfaction of a condition, the memory device may perform a read refresh operation on the memory cell during which the threshold voltage of the memory cell may be modified. In some cases, the duration of the read refresh operation may be longer than the duration of a read operation performed by the memory device on the memory cell or on a different memory cell.

20 Claims, 8 Drawing Sheets

(56) References Cited

U.S. PATENT DOCUMENTS

2017/0345499 A1   11/2017  Sills
2019/0080782 A1    3/2019  Mariani et al.
2019/0304552 A1   10/2019  Boenapalli et al.

OTHER PUBLICATIONS

Chinese Patent Office, "Office Action and Search Report", issued in connection with Chinese Patent Application No. 202080077283.3 dated Aug. 24, 2022 (9 pages).

* cited by examiner

RESTORING MEMORY CELL THRESHOLD VOLTAGES

CROSS REFERENCE

The present application for Patent is a continuation of U.S. patent application Ser. No. 16/684,526, by Yang et al., entitled "RESTORING MEMORY CELL THRESHOLD VOLTAGES," filed Nov. 14, 2019, assigned to the assignee hereof, and is expressly incorporated by reference in its entirety herein.

BACKGROUND

The following relates generally to a system that includes at least one memory device and more specifically to restoring memory cell threshold voltages.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

A memory device may include memory cells that have respective associated threshold voltages that affect how the memory cells function. For example, the flow of current through a phase change memory (PCM) memory cell, as one example, may depend on the threshold voltage of the memory cell. A memory device may be designed to operate memory cells that have threshold voltages within a particular range. But in some cases, the threshold voltage of a memory cell may move outside the range for which the memory device was designed. For example, the threshold voltage of the memory cell may increase over time due to drift or may be disturbed (e.g., altered) due to operations of the memory device. A memory cell that has a threshold voltage outside the range for which a memory device is designed may function incorrectly resulting in data errors and decreased system performance.

According to the techniques and apparatuses described herein, a memory device may use a long refresh operation to restore (or "refresh") the threshold voltage of a memory cell so that is falls within the range appropriate for the memory device. For example, during the refresh operation the memory device may apply to the memory cell one or more current pulses with sufficient amplitude and duration to change one or more parameters of the memory cell, such as the structure of the material making up the memory element of the cell. Because the threshold voltage of the memory cell may be a function of the material's structure, the long refresh operation may change the threshold voltage of the memory cell so that it falls within the range appropriate for the memory device.

Features of the disclosure are initially described in the context of a memory system and memory die as described with reference to FIGS. 1 and 2. Features of the disclosure are described in the context of a memory array and current waveforms as described with reference to FIGS. 3 and 4. These and other features of the disclosure are further illustrated by and described with reference to an apparatus diagram and flowcharts that relate to threshold voltage restoration as described with references to FIGS. 5-8.

Figure 1:
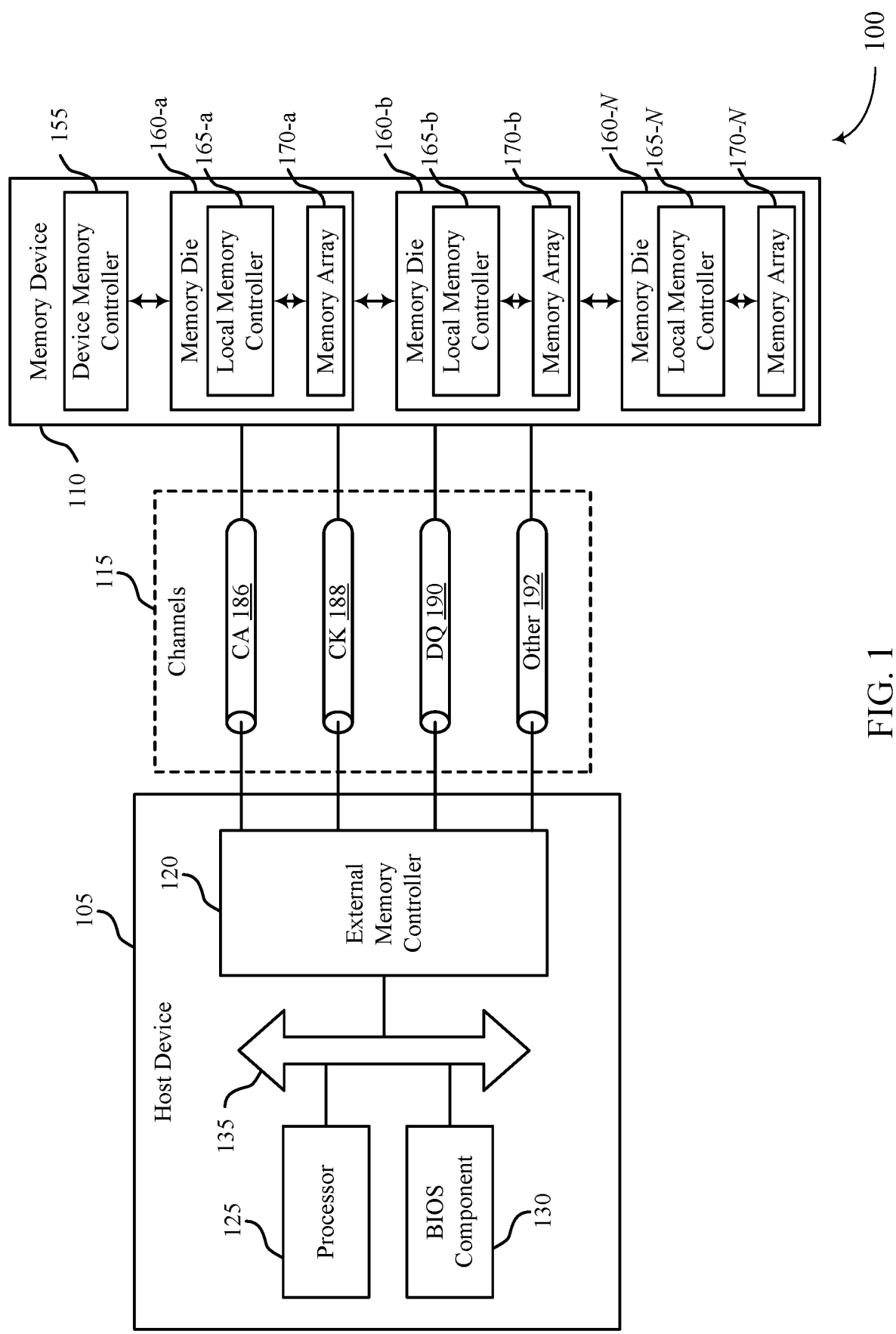
FIG. 1 illustrates an example of a system that supports restoring memory cell threshold voltages in accordance with examples as disclosed herein.

FIG. 1 illustrates an example of a system 100 that utilizes one or more memory devices in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system configured to store data for one or more other components of the system 100.

The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105. In some examples, the system 100 may be a graphics card. The host device 105 may include one or more of an external memory controller 120, a processor 125, a basic input/output system (BIOS) component 130, or other components such as one or more peripheral components or one or more input/output controllers. The components of host device may be in electronic communication with one another using a bus 135.

A memory device 110 may be an independent device or a component that is configured to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin designs for communicating the signals, various form factors for physical packaging of the host device 105 and the memory device 110, clock signaling and synchronization between the host device 105 and the memory device 110, timing conventions, or other factors.

The memory device 110 may be configured to store data for the components of the system 100. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The processor 125 may be configured to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The components of system 100 may be made up of general-purpose or special purpose circuitry designed to carry out one or more functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being configured to store at least one bit of data. A memory device 110 including two or more memory dice may be referred to as a multi-die memory or a multi-die package or a multi-chip memory or a multi-chip package.

The memory device 110 may be an example of a two-dimensional (2D) array of memory cells or may be an example of a three-dimensional (3D) array of memory cells. A 2D memory device 110 may include a single memory die 160. A 3D memory device 110 may include two or more memory dice 160 (e.g., memory die 160-a, memory die 160-b, any quantity of memory dice 160-N), which may be stacked on top of one another or positioned next to one another (e.g., relative to a substrate). In some examples, memory dice 160 in a 3D memory device 110 may be referred to as decks, levels, layers, or dies. A 3D memory device 110 may include any quantity of stacked memory dice 160 (e.g., two high, three high, four high, five high, six high, seven high, eight high). In some 3D memory devices 110, different decks may share at least one common access line such that some decks may share one or more of a word line, a digit line, or a plate line. In some cases, the memory cells on different decks may have different properties or characteristics. For example, in a phase change memory (PCM) system, the memory cells on one deck may have a slower crystallization rate than the memory cells on a different deck. In such cases, the system 100 may apply different length refresh operations on the memory decks to accommodate the different crystallization rates.

The device memory controller 155 may include circuitry, logic, or components configured to control operation of the memory device 110. The device memory controller 155 may include the hardware, the firmware, or the instructions that enable the memory device 110 to perform various operations and may be configured to receive, transmit, or execute commands, data, or control information related to the components of the memory device 110. The device memory controller 155 may be configured to communicate with one or more of the external memory controller 120, the one or more memory dice 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data on behalf of the host device 105 or a read command indicating that the memory device 110 is to provide data stored in a memory die 160 to the host device. In some cases, the memory device 110 may receive a long refresh command indicating that the memory device 110 is to perform a long refresh operation on a set of memory cells. A long refresh operation may also be referred to herein as a read refresh operation.

A local memory controller 165 (e.g., local to a memory die 160) may be configured to control operation of the memory die 160. In some examples, a local memory controller 165 may be configured to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be configured to communicate with the device memory controller 155, with other local memory controllers 165, or directly with the external memory controller 120, or the processor 125, or a combination thereof.

Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuitry or controllers configured for supporting described operations of the device memory controller 155 or local memory controller 165 or both. In some cases, a local memory controller 165 may trigger a long refresh operation as described herein. For example, the local memory controller 165 may detect that a condition is satisfied and prompt components of a memory array to carry out the long refresh operation.

The external memory controller 120 may be configured to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may include or be associated with one or more signal paths or transmission mediums (e.g., conductors) between terminals associated with the components of system 100. For example, a channel 115 may include a first terminal including one or more pins or pads at the host device 105 and one or more pins or pads at the memory device 110. A pin may be an example of a conductive input or output point of a device of the system 100, and a pin may be configured to act as part of a channel. In some examples, the host device 105 may trigger the long refresh operation as described herein. For example, the host device 105 may determine that a condition is satisfied (e.g., based on information from a local memory controller 165) and send a long refresh command to the local memory controller 165. In some cases, the external memory controller 120 may act as a relay for communications between host device 105 and memory device 110.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, may be communicated over the channels 115 using single data rate (SDR) signaling or double data rate (DDR) signaling. In SDR signaling, for example, one modulation symbol (e.g., signal level) of a signal may be registered for each clock cycle (e.g., on a rising or falling edge of a clock signal). In DDR signaling, for example, two modulation symbols (e.g., signal levels) of a signal may be registered for each clock cycle (e.g., on both a rising edge and a falling edge of a clock signal).

In some examples, the channels 115 may include one or more command and address (CA) channels 186. The CA channels 186 may be configured to communicate commands between the host device 105 and the memory device 110 including control information associated with the commands (e.g., address information). For example, the CA channel 186 may include a read command with an address of the desired data. In some examples, the CA channels 186 may be registered on one or more of a rising clock signal edge or a falling clock signal edge. In some examples, a CA channel 186 may include any quantity of signal paths to decode one or more of address or command data (e.g., eight or nine signal paths). In some cases, the CA channel 186 may be used to convey a long read refresh command from the host device 105 to the memory device 110.

The memory cells of memory device 110 may have various properties that affect how the memory cells function. For example, in PCM each memory cell may have an associated threshold voltage that affects the current flow through the memory cell. Because PCM relies on the current flow through a memory element to write and read logic states at a memory cell, memory device 110 may be configured to operate memory cells that have threshold voltages within a particular range. But various mechanisms may cause the threshold voltage of a memory cell to move outside the range, resulting in errors when the memory cell is operated. According to the techniques described herein, a system 100 may correct changes in a memory cell's threshold voltage by performing a long refresh operation on the memory cell. A long refresh operation may also be referred to herein as a read refresh operation.

Figure 2:
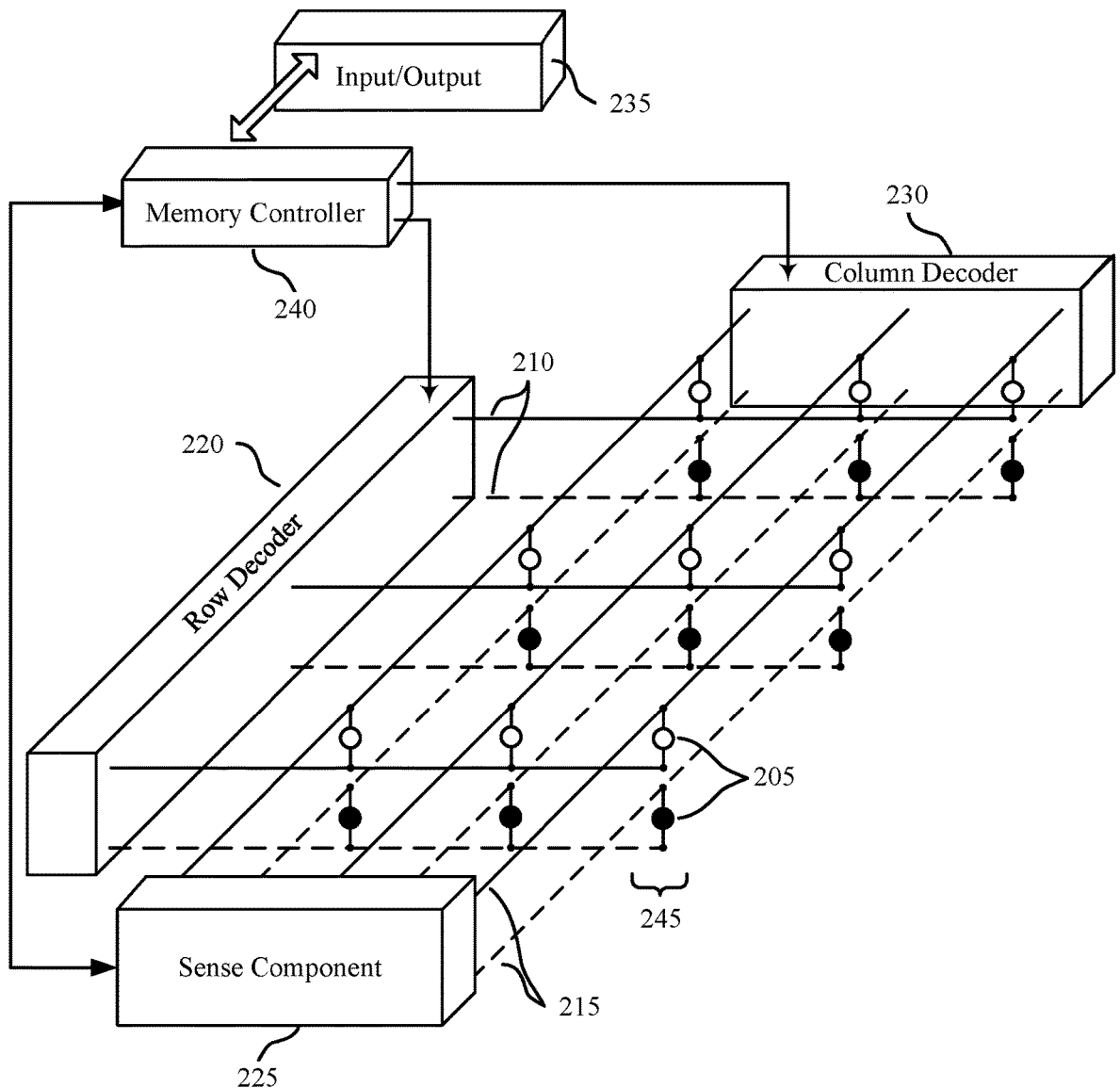
FIG. 2 illustrates an example of a memory die that supports restoring memory cell threshold voltages in accordance with examples as disclosed herein.

FIG. 2 illustrates an example of a memory die 200 in accordance with examples as disclosed herein. Memory die 200 may also be referred to as an electronic memory apparatus. Memory die 200 includes memory cells 205 that are programmable to store different states. Each memory cell 205 may be programmable to store two states, denoted a logic 0 and a logic 1. In some cases, memory cell 205 is configured to store more than two logic states. A memory cell 205 may include a material, which may be referred to as a memory element, having a variable and configurable electrical resistance that is representative of the logic states. For example, a material with a crystalline or an amorphous atomic configuration may have different electrical resistances. A crystalline state may have a low electrical resistance and may, in some cases, be referred to as the "set" state. An amorphous state may have a high electrical resistance and may be referred to as the "reset" state. A voltage applied to the memory cell 205 may thus result in different currents depending on whether the material is in a crystalline or an amorphous state, and the magnitude of the resulting current may be used to determine the logic state stored by memory cell 205.

In some cases, a material in the crystalline or set state may have a threshold voltage associated with it—that is, current flows after the threshold voltage is exceeded. Thus, if the applied voltage is less than the threshold voltage, no current may flow if the memory element is in the set state. If the memory element is in the reset state, it may have a threshold voltage substantially higher than the threshold voltage associated with the set state. The threshold voltage of a memory cell may be a function of the crystallization of the material making up the memory element of the memory cell 205. For example, the threshold voltage of a memory cell 205 may be inversely related to the volume of crystallization of the memory element material. Thus, a memory element that has a relatively large volume of crystallization may have a relatively low threshold voltage and a memory element that has a relatively small volume of crystallization may have a relatively high threshold voltage.

Memory die 200 may be a three-dimensional (3D) memory array, where two-dimensional (2D) memory arrays are formed on top of one another. Such a configuration may increase the quantity of memory cells that may be placed or created on a single die or substrate as compared with 2D arrays, which in turn may reduce production costs or increase the performance of the memory array, or both. According to the example depicted in FIG. 2, memory die 200 includes two levels of memory cells 205; however, the quantity of levels is not limited to two. Each level may be aligned or positioned so that memory cells 205 may be approximately aligned with one another across each level, forming a memory cell stack 245.

Each row of memory cells 205 is connected to a word line 210, and each column of memory cells 205 is connected to a digit line 215. Thus, one memory cell 205 may be located at the intersection of a word line 210 and a digit line 215. This intersection may be referred to as a memory cell's address. Word lines may also be known as access lines and, in some cases, digit lines 215 may be referred to as a bit lines. References to word lines and digit lines, or their analogues, are interchangeable without loss of understanding or operation. Word lines 210 and digit lines 215 may be substantially perpendicular to one another to create an array.

In a three-dimensional array, each level may have a word line 210 and a digit line 215. In other examples, two levels may share a common word line 210 or digit line 215 (not shown). In some cases, electrodes may be coupled to a memory cell 205 and a word line 210 or a digit line 215. The term electrode may refer to an electrical conductor, and in some cases, may be employed as an electrical contact to a memory cell 205. An electrode may include a trace, wire, conductive line, conductive material, or the like that provides a conductive path between elements or components of memory die 200.

Operations such as reading and writing may be performed on memory cells 205 by activating or selecting a word line 210 and digit line 215. Activating or selecting a word line 210 or a digit line 215 may include applying a voltage or a current to the respective line. Word lines 210 and digit lines 215 may be made of conductive materials, such as metals (e.g., copper, aluminum, gold, tungsten, titanium, etc.), metal alloys, carbon, or other conductive materials, alloys, or compounds. Upon selecting a memory cell 205, the resulting signal may be used to determine the stored logic state. For example, a voltage may be applied and the resulting current may be used to differentiate between the resistive states of the phase change material. Because the resistive state of a memory cell is related to its threshold voltage, changes in the threshold voltage may cause errors during the differentiation process (e.g., during a sense operation).

Accessing memory cells 205 may be controlled through a row decoder 220 and a column decoder 230. For example, a row decoder 220 may receive a row address from the memory controller 240 and activate the appropriate word line 210 based on the received row address. Similarly, a column decoder 230 receives a column address from the memory controller 240 and activates the appropriate digit line 215. Thus, by activating a word line 210 and a digit line 215, a memory cell 205 may be accessed.

Upon accessing, a memory cell 205 may be read, or sensed, by sense component 225. For example, sense component 225 may be configured to determine the stored logic state of memory cell 205 based on a signal generated by accessing memory cell 205. The signal may include a voltage or electrical current, and sense component 225 may include voltage sense amplifiers, current sense amplifiers, or both. For example, a voltage may be applied to a memory cell 205 (using the corresponding word line 210 and digit line 215) and the magnitude of a resulting current may depend on the applied voltage and the threshold voltage of the memory cell 205. Sense component 225 may include various transistors or amplifiers in order to detect and amplify a signal, which may be referred to as latching. The detected logic state of memory cell 205 may then be output as output 235. In some cases, sense component 225 may be a part of column decoder 230 or row decoder 220. Or, sense component 225 may connected to or in electronic communication with column decoder 230 or row decoder 220.

A memory cell 205 may be set, or written, by similarly activating the relevant word line 210 and digit line 215—i.e., a logic value may be stored in the memory cell 205. Column decoder 230 or row decoder 220 may accept data, for example input 235, to be written to the memory cells 205. In the case of phase change memory, a memory cell 205 is written by heating the memory element, for example, by passing a current through the memory element. The voltages used to apply a current to a memory cell 205 may depend on the various threshold voltages of the memory elements, and in some cases, a threshold voltage associated with a selection component. This process is discussed in more detail below.

In some memory architectures, accessing the memory cell 205 may degrade or destroy the stored logic state and re-write or refresh operations may be performed to return the original logic state to memory cell 205. In DRAM, for example, the logic-storing capacitor may be partially or completely discharged during a sense operation, corrupting the stored logic state. So the logic state may be re-written after a sense operation. Additionally, activating a single word line 210 may result in the discharge of all memory cells in the row; thus, all memory cells 205 in the row may need to be re-written. But in non-volatile memory, such as PCM, accessing the memory cell 205 may not destroy the logic state and, thus, the memory cell 205 may not require re-writing after accessing.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. Non-volatile PCM cells may have beneficial properties that may result in improved performance relative to other memory architectures. For example, PCM may offer comparable read/write speeds as DRAM but may be non-volatile and may offer increased cell density.

The memory controller 240 may control the operation (read, write, re-write, refresh, etc.) of memory cells 205 through the various components, for example, row decoder 220, column decoder 230, and sense component 225. In some cases, one or more of the row decoder 220, column decoder 230, and sense component 225 may be co-located with the memory controller 140. Memory controller 240 may generate row and column address signals in order to activate the desired word line 210 and digit line 215. Memory controller 240 may also generate and control various voltage potentials or currents used during the operation of memory die 200. In general, the amplitude, shape, or duration of an applied voltage or current discussed herein may be adjusted or varied and may be different for the various operations discussed in operating memory die 200. Furthermore, one, multiple, or all memory cells 205 within memory die 200 may be accessed simultaneously; for example, multiple or all cells of memory die 200 may be accessed simultaneously during a reset operation in which all memory cells 205, or a group of memory cells 205, are set to a single logic state.

As noted, a read operation of a memory cell 205 may depend on the threshold voltage of the memory cell 205 because the logic state of the memory cell 205 is sensed based on the amount of current that flows through the memory cell 205 when a particular voltage or current is applied. So, it is desirable for the threshold voltage of a memory cell 205 to stay within a determined range for each state. But in some cases, one or more mechanisms may shift the threshold voltage of a memory cell 205. For example, the threshold voltage of a memory cell 205 may increase over time due to a phenomenon referred to as "drift." In some cases, the passive increase in threshold voltage caused by drift is exacerbated by operations of the memory die 200. For example, a read operation performed on a memory cell may further increase the threshold voltage of a memory cell 205, a phenomenon referred to herein as "disturb."

A memory cell 205 in the set state may be more compromised by drift and disturb than a memory cell 205 in the reset state due to the low threshold voltage associated with the set state. That is, the amount change in threshold voltage relative to the initial threshold voltage of the set state maybe greater than that relative to the reset state because the initial threshold voltage of the reset state is significantly higher than that of the set state. Thus, drift and disturb may be particularly problematic for memory cells in the set state.

A memory die 200 may attempt to correct changes in threshold voltage by performing a refresh operation on the memory cells 205. The refresh operation may be a read operation that returns results (e.g., sensed logic states) that are not processed. Because the current applied to a memory cell 205 during a portion of the read operation causes crystallization of the material within the memory cell 205, the refresh operation may decrease the threshold voltage of a memory cell 205. But in some cases, the refresh operation is insufficient to fully restore the threshold voltage of a memory cell 205. For example, the pre-refresh threshold voltage of the memory cell 205 may be so high that the refresh operation cannot reduce it to an appropriate level. Such a scenario may arise when the initial threshold voltage of the memory cell 205 (e.g., the threshold voltage before drift and/or disturb occurs) is already at the edge of the acceptable range, when the threshold voltage is affected by both drift and disturb, and/or when the refresh operation disturbs the threshold voltage more than it corrects it.

According to the techniques described herein, a memory die 200 may use a long refresh operation to restore threshold voltages that cannot be restored by a regular refresh operation. Because the long refresh operation involves a longer application of current to the memory cell 205, the crystals within the memory cell 205 may have a longer amount of time to grow. This means that the long refresh operation can correct changes in threshold voltage that arise due to drift and any disturb caused by the long refresh operation. Thus, the threshold voltage of the memory cell 205 may be reduced to an acceptable level even if it initially starts out too high for the regular refresh operation to correct.

The long refresh operation (which may also be referred to as a read refresh operation) may be facilitated by the memory controller 240, which may be an example of a local memory controller 165 as described with reference to FIG. 1. In some examples, the memory controller 240 may trigger the long refresh operation in response to a long refresh command received from another component (e.g., a host device 105 or external memory controller 120). In other examples, the memory controller 240 may autonomously trigger the long refresh operation based on detection of a condition associated with the operation of a memory array that includes memory cells 205. For example, the memory controller 240 may detect that a threshold quantity of reads have been performed on the memory array, or that an error rate (e.g., a raw bit error rate (RBER)) has been exceeded, that a threshold amount of time has elapsed since the last write operation or long refresh operation was performed, or that a command for the long refresh operation has been received.

Although described with reference to a particular type of memory and memory architecture, the techniques described herein can be implemented for any type of PCM memory and memory architecture.

Figure 3:
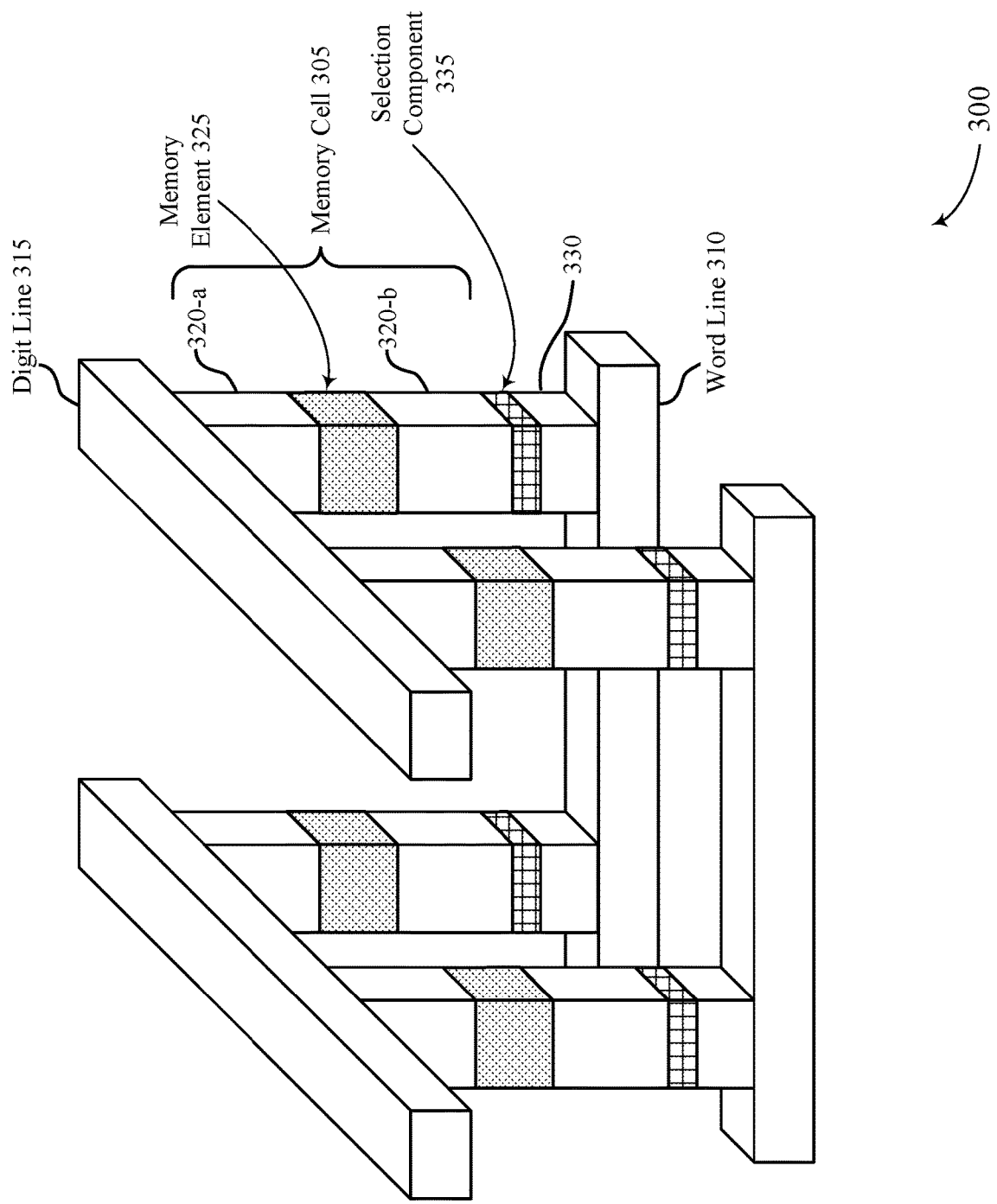
FIG. 3 illustrates an examples of a memory array that supports restoring memory cell threshold voltages in accordance with examples as disclosed herein.

FIG. 3 illustrates an example memory array 300 that supports restoring memory cell threshold voltages in accordance with examples as disclosed herein. Memory array 300 may be an example of memory die 200 with reference to FIG. 2. Memory array 300 includes memory cells 305, word lines 310, and digit line 315, which may be examples of a memory cell 205, word line 210, and digit line 215, as described with reference to FIG. 2. A memory cell 305 may include electrodes 320-a and 320-b and memory element 325. Memory array 300 may also include bottom electrode 330 and selection component 335. Selection component may also be referred to as a selection device.

A 3D memory array may be created by forming multiple memory arrays 300 on top of one another. In some cases, levels may be separated by an electrically insulating material or, in other cases, two levels may have a common word line 310 or digit line 315. For example, another level may be positioned above memory array 300, and digit line 315 may be common to both levels. As described above, various logic states may be stored by programming the electrical resistance of memory element 325. Programming memory cell 305 may include passing a current through memory cell 305, heating memory cell 305, or melting the memory element 325 wholly or partially.

Selection component 335 may, in some cases, be connected in series between a memory cell 305 and at least one conducive line such as a word line 310 or a digit line 315. For example, as depicted in FIG. 3, selection component 335 may be located between electrode 320-b and bottom electrode 330; thus, selection component 335 may be located in series between memory cell 305 and word line 310. However, other configurations of the selection component 335 are also possible. For example, selection component 335 may be in series between memory cell 305 and digit line 315. The selection component 335 may aid in selecting a particular memory cell 305 or may help prevent stray currents from flowing through non-selected memory cells adjacent a selected memory cell. For example, the selection component 335 may shield memory cell 305 from current that arises when word line 310 is activated to access a memory cell other than memory cell 305.

In some cases, the selection component 335 may include a phase change material. In such cases, the selection component 335 may designed so that the selection component 335 does not function as a memory storage component during the operation of memory array 300. However, because the selection component 335 includes a phase change material, the selection component 335 may have an associated threshold voltage. This threshold voltage may drift or be disturbed as described herein. Accordingly, the selection component 335 may benefit from a long read refresh operation that restores its threshold voltage to an acceptable level.

As discussed, memory cells of FIG. 3 may include a memory element 325 that has a variable electrical resistance. Variable resistance materials may refer to various material systems, including, for example, metal oxides, chalcogenides, and the like. Chalcogenide materials are materials or alloys that include at least one of the elements sulfur (S), selenium (Se), or tellurium (Te). Many chalcogenide alloys may be possible—for example, a germanium-antimony-tellurium alloy (Ge—Sb—Te) is a chalcogenide material. Other chalcogenide alloys not expressly recited here may also be employed. Thus, memory array 300 may be an example of PCM.

PCM exploits the large resistance contrast between crystalline and amorphous states in phase change materials, which may be chalcogenide materials. A material in a crystalline state may have atoms arranged in a periodic structure, which may result in a relatively low electrical resistance (e.g., set state). By contrast, material in an amorphous state with no or relatively little periodic atomic structure may have a relatively high electrical resistance (e.g., reset state). The difference in resistance values between amorphous and crystalline states of a material may be significant; for example, a material in an amorphous state may have a resistance one or more orders of magnitude greater than the resistance of the material in its crystalline state.

To set a low-resistance state, a memory cell 305 may be heated by passing a current through the memory cell 305. Heating caused by electrical current flowing through a material with a finite resistance may be referred to as Joule or ohmic heating. Joule heating may thus be related to the electrical resistance of electrodes or phase change material. Heating the phase change material to an elevated temperature (but below its melting temperature) may result in the phase change material crystallizing and forming the low-resistance state. The current may result from applying a voltage to memory cell 305, where the applied voltage is based on the threshold voltage of memory element 325, the threshold voltage of selection component 335, or their sum. For example, if memory element 325 is in a reset state, current may not flow through memory cell 305 unless the applied voltage is greater than the sum of the threshold voltages of selection component 335 and memory element 325. In some cases, a memory cell 305 may be heated by means other than Joule heating, for example, by using a laser.

To set a high-resistance state, the phase change material may be heated above its melting temperature, for example, by Joule heating. The amorphous structure of the molten material may locked in by abruptly removing the applied current to quickly cool the phase change material, which may be known as "quenching." The electrical currents or voltages, or both, used for writing (e.g., setting) memory cell 305 may be applied by a memory controller.

As noted, a memory element 325 in the crystalline state (e.g., the set state) may have a threshold voltage associated with it and current may not flow until the threshold voltage is exceeded. But the threshold voltage may vary over time or in response to operations of memory array 300. For example, drift may occur in which the threshold voltage of a memory element 325 increases with time. Additionally, the threshold voltage of a memory element 325 may be disturbed when the current applied to the memory cell 305 increases rapidly (e.g., spikes) during a read operation. Between these two phenomenon the threshold voltage of a memory cell may be altered so that it is higher than its original value. Because the logic state of a memory cell 305 is determined based on the current that flows in response to a particular applied voltage, variations in the threshold voltage caused by drift and disturb may result in erroneous reads, thereby negatively impacting the reliability and performance of the memory device associated with memory array 300.

To restore the threshold voltage of a memory cell 305, a memory device may implement a refresh operation. A refresh operation may include performing a read operation on the memory cell 305 but not processing the results (e.g., discarding or ignoring the data). A refresh operation may restore the threshold voltage of a memory element 325 by flowing current through the memory element 325, which allows the crystals within the memory element 325 to grow. Because the threshold voltage is a function of the crystallization of phase change material, modifying the volume of crystallization may alter the threshold voltage of the memory element 325. For example, the threshold voltage of a memory element 325 may be inversely related to the crystallization of the memory element 325, meaning that increasing the volume of crystallization may reduce the threshold voltage.

But for some memory elements 325 (e.g., memory elements with original threshold voltages that are relatively high), a regular refresh operation may be insufficient to restore the threshold voltage to an appropriate level. This is because the duration of the read operation may be too short for the current applied to the memory element to recrystallize the memory element to an appropriate volume. For example, the volume of crystallization may be so small (e.g., due to a combination of drift and disturb) that the current applied during the read operation grows the crystallization to a fraction of the volume needed for the memory element 325 to function properly.

According to the techniques described herein, a memory device may restore the threshold voltage of a memory cell 305 by using a long refresh operation (e.g., a refresh operation that applies current to the memory cell 305 for a longer duration of time than a read operation or regular refresh operation). The long refresh operation may performed so that the current applied to the memory cell 305 increases the crystallization volume of the memory element 325, resulting in a threshold voltage that is reduced relative to the threshold voltage before performance of the long refresh operation. The terms refresh and restore may be used interchangeably.

Using a long refresh operation to restore threshold voltages may provide one or more distinct advantages compared to other solutions. For example, although a memory device might attempt to restore the threshold voltage of a memory cell 305 by performing back-to-back regular refresh operations on a memory cell 305, doing so may take longer and consume more resources than a performing a long refresh operation. Further, performing back-to-back refresh operations may exacerbate the issue in cases where each refresh operation disturbs the memory cell more than it corrects it. That is, the spike in current at the beginning of a refresh operation may increase the threshold voltage more than the subsequent current pulse decreases the threshold voltage, resulting in an ever-increasing threshold voltage. Alternatively, the memory device may attempt to fully restore the threshold voltage by writing to the memory cell 305. But such a technique significantly increases latency and power consumption because a write operation takes longer and draws more current than a long refresh operation.

In some cases, the long refresh operation may also restore the threshold voltage of a selection component 335. Like memory element 325, the selection component 335 may have an associated threshold voltage that varies with drift and disturb, and current may not flow through the selection component unless a voltage higher than the threshold voltage is applied across the selection component 335. Because the selection component 335 provides access to the memory cell 305, a suitably large increase in the threshold voltage (e.g., due to drift and disturb) may disrupt a read operation performed on the memory cell 305. So, a device that applies the long refresh operation to a memory cell 305 to restore its threshold voltage may also advantageously restore the threshold voltage of the selection component 335 corresponding to the memory cell 305.

In some cases, long refresh operations of different durations may be performed on different portions of memory. For example, a memory device may perform a first long refresh operation with a first duration on a first memory deck and perform a second long refresh operation with a second duration on a second memory deck. The first and second durations may be longer than the duration of a read or regular refresh operation but different than each other. Such variation in the duration of long refresh operations may allow a memory device to efficiently refresh memory decks that have different crystallization rates.

In one example, the memory cells on one memory deck may have a slower crystallization rate than the memory cells on another memory deck. This means that applying long refresh operations with uniform durations to both decks may waste power (because current is applied for longer than needed to restore the threshold voltages of cells on the fast-growing deck) or result in inadequate refreshment (because current is applied for a shorter duration than needed to restore the threshold voltages of cells on a slow-growing deck). To compensate for varied crystallization rates across decks, a memory device may tailor the duration of long refresh operations to fit the crystallization rate of each deck.

For example, the memory device may determine the appropriate duration of a long refresh operation for each deck based on the crystallization rate of that deck. The memory device may then store a value indicative of the duration in in fuses or memory associated with the memory deck. When the memory device determines that it is time to perform a long refresh operation on a deck, the memory device may retrieve the duration from the fuses/memory corresponding to the targeted deck so that the memory device knows how long the long refresh operation should be. Thus, a memory device may apply a long refresh operation that has a duration long enough to fully refresh the memory cells in the deck but short enough to avoid unnecessary power consumption. Although described with reference to memory decks, the duration-variation techniques described herein can be implemented for any region of memory.

Figure 4:
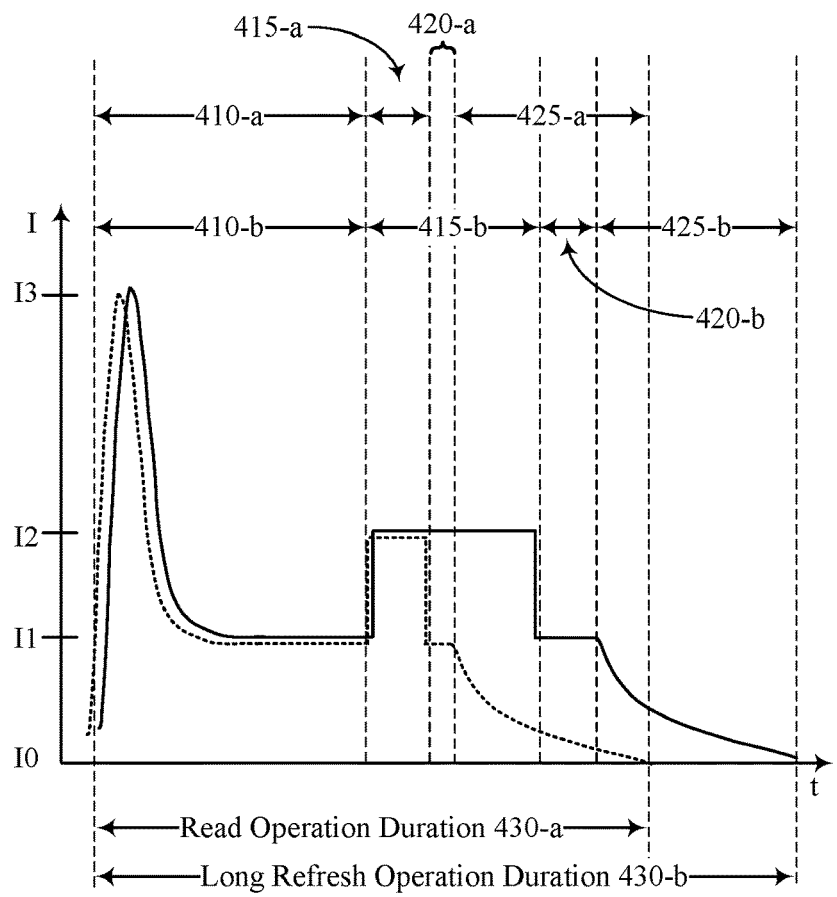
FIG. 4 illustrates an example of a graph of current waveforms that support restoring memory cell threshold voltages in accordance with examples as disclosed herein.

FIG. 4 illustrates an example graph 400 showing current waveforms 405 in accordance with examples as disclosed herein. The current waveform 405-$a$ may represent the current applied to a memory cell during a read operation and the current waveform 405-$b$ may represent current applied to a memory cell during a long refresh operation (or "read refresh operation"). Thus, the current waveforms 405 are shown plotted as current ("I") versus time (t). The current waveforms 405 may also be referred to herein as current sequences. For example, the current waveform 405-$a$ may be referred to as a first current sequence and the current waveform 405-$b$ may be referred to a second current sequence. Applying current as shown in current waveform 405-$b$ may restore the threshold voltage of a memory cell that has increased to drift and disturb.

Each current waveform 405 may have multiple phases. For example, current waveform 405-$a$ may have a sensing phase that has duration 410-$a$, a first refresh phase that has duration 415-$a$, second refresh phase that has duration 420-$a$, and a deselection phase that has duration 425-$a$. Similarly, current waveform 405-$b$ may have a sensing phase that has duration 410-$b$, a first refresh phase that has duration 415-$b$, second refresh phase that has duration 420-$b$, and a deselection phase that has duration 425-$b$. The current applied to a memory cell during a particular phase may be referred herein as a current pulse. Thus, current waveform 405-$a$ and current waveform 405-$b$ may each include four current pulses. Although shown with particular shapes, the current pulses may vary in shape and still implement the techniques described herein.

The sensing phase (which may also be referred to as the Tsense phase) may begin the read operation or long refresh operation. The sensing phase may refer to a phase during which the memory cell is selected and its stored state is sensed. The sensing phase may involve increasing the current applied to the memory cell until it reaches current level I3, decreasing the current to current level I1, and maintaining the current at current level I1 for a first period of time. In some cases, the spike in current during the sensing phase may disturb the threshold voltage of a memory cell, resulting in an increase of the threshold voltage that, combined with an increase due to drift, moves the threshold voltage outside the operating range of the memory device.

The sensing phase may be the same duration for a read operation and a long refresh operation. Thus, duration 410-$a$ may be equal to duration 410-$b$ (e.g., the durations 410 may be 47 nanoseconds (ns)). However, although the durations 410-$a$ and 410-$b$ may be equal, in some cases, the current applied during the sensing phase of the long refresh operation may be higher than the current applied during the sensing phase of the read operation. For example, the current applied to the memory cell during duration 410-$b$ may be increased to a level higher than current level I1 and reduced to a level higher than current level I2.

After the sensing phase, the first refresh phase (which may also be referred to the Tgrowth phase) may occur. The first refresh phase may refer to a phase during which the threshold voltage of the memory cell is refreshed (e.g., reduced from one level to a lower level). The first refresh phase may involve increasing the current applied to the memory cell from current level I1 to current level I2 and maintaining the current at current level I2 for a second period of time. The current level I2 may be selected so that the current applied to the memory cell during the first refresh phase causes the phase change material in the memory element of the memory cell to crystalize, resulting in a lower threshold voltage. Thus, the first refresh phase may refresh the threshold voltage of the memory cell.

But unlike the sensing phase, the first refresh phase for current waveform 405-a may have a different duration than the first refresh phase for current waveform 405-b. This is because the duration 415-a for the first refresh phase of the read operation may be too short to recrystallize the phase change material to a suitable volume for operation of the memory cell. That is, the duration 415-a may be too short to fully compensate for increases in threshold voltage due to drift and disturb. Accordingly, the duration 415-b may be longer than the duration 415-a so that the phase change material has time to recrystallize to a suitable level. For example, the duration 415-a may be 20 ns and the duration 415-b may be 70 ns. Although shown as substantially similar, the current applied during the first refresh phase of the long refresh operation may be higher than the current applied during the first refresh phase of the read operation. For example, the current applied to the memory cell during duration 415-b may be increased to a level higher than current level I2.

The second refresh phase (which may also be referred to as the Tsetback phase) may occur after the first refresh phase. The second refresh phase may refer to a phase during which the threshold voltage of the selection component corresponding to the memory cell is refreshed. The second refresh phase may involve decreasing the current applied to the memory cell (and thus the selection component) from current level I2 to current level I1 and maintaining the current at current level I1 for a third period of time. The current level I1 may be selected so that the current applied to the memory cell (and thus the selection component) during the second refresh phase causes the phase change material in the selection component to crystalize, resulting in a lower threshold voltage. Thus, the second refresh phase may refresh the threshold voltage of the selection component.

Like the first refresh phase, the second refresh phase for current waveform 405-a may have a different duration than the second refresh phase for current waveform 405-b. This is because the duration 420-a for the second refresh phase of the read operation may be too short to recrystallize the phase change material to a suitable volume for operation of the selection component. Accordingly, the duration 420-b may be longer than the duration 420-a so that the phase change material has time to recrystallize to a suitable level. For example, the duration 420-b may be 45 ns longer than the duration 420-a. However, in some implementations, the second refresh phase of current waveform 405-b may have the same duration (e.g., duration 420-a) as the second refresh phase of current waveform 405-a so that power can be conserved.

Although shown as substantially similar, the current applied during the second refresh phase of the long refresh operation may be higher than the current applied during the second refresh phase of the read operation. For example, the current applied to the memory cell during duration 420-b may be decreased to a level higher than current level I1.

The deselection phase (which may also be referred to as the termination phase) may occur after the second refresh phase and may be the last phase of the read operation and the last phase of the long refresh operation. The second refresh phase may refer to a phase during which the memory cell is deselected and slowly turned off. The second refresh phase may involve reducing the current applied to the memory cell from current level I1 to current level I0, which is some examples may be 0 microamps ($\mu A$).

Thus, a long refresh operating may be performed on a memory cell by applying a current as shown in current waveform 405-b (e.g., by applying a current to a memory cell and varying its amplitude as shown in current waveform 405-a). The duration 430-b of the long refresh operation may be longer than the duration 430-a of the read operation so that a threshold voltage of the memory cell can be more completely refreshed. Some of the phases of the long refresh operation (e.g., the first and second refresh phases) may be longer than corresponding phases of the read operation, which may facilitate crystallization and threshold voltage reduction. Other phases of the long refresh operation (e.g., the sensing and deselection phases) may be substantially the same duration as corresponding phases of the read operation to avoid unnecessary increases in latency and power consumption.

Figure 5:
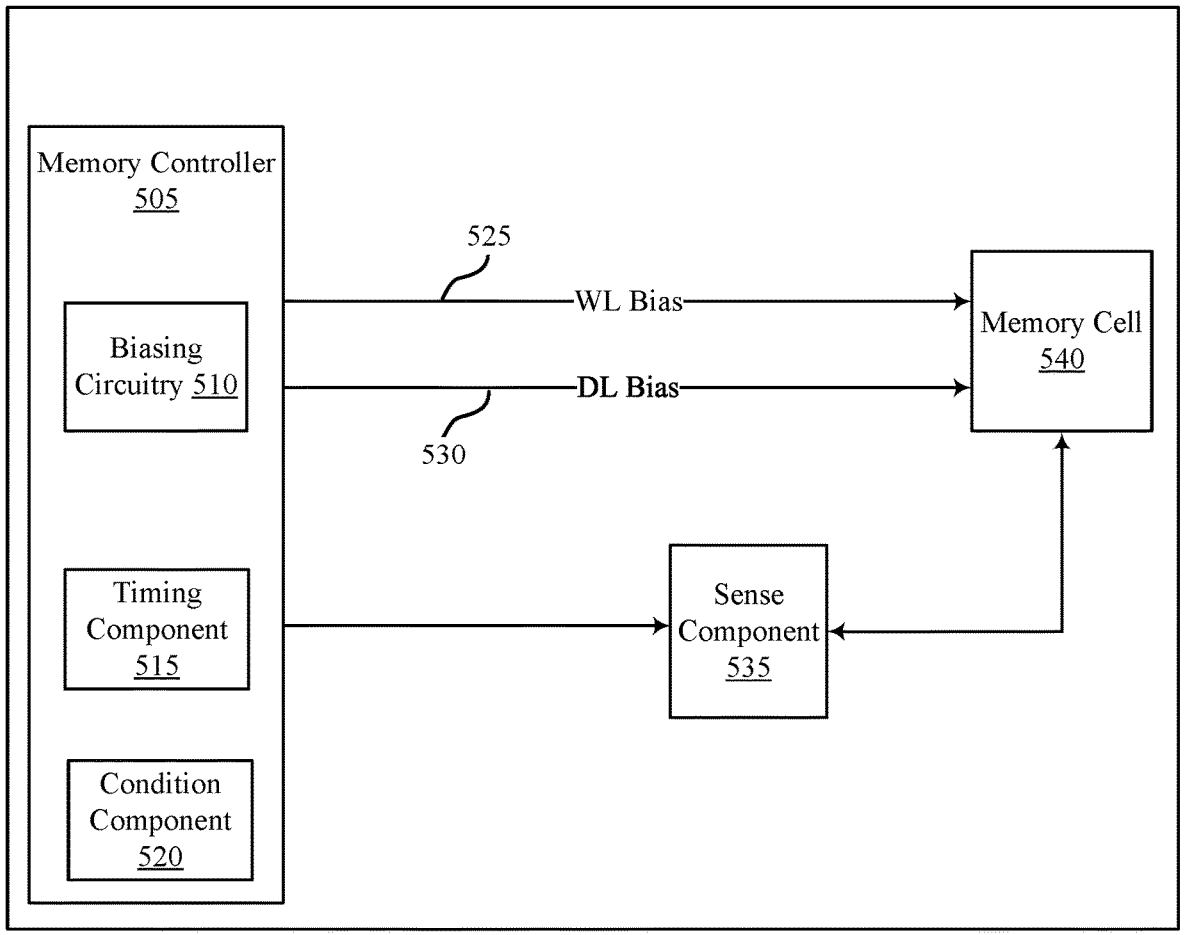
FIG. 5 illustrates a memory apparatus that supports restoring memory cell threshold voltages in accordance with examples as disclosed herein.

FIG. 5 shows a block diagram of a memory apparatus 500 that supports restoring memory cell threshold voltages in accordance with examples as disclosed herein. Memory apparatus 500 may include memory controller 505, which may be an example of an external memory controller 120, local memory controller 165, or memory controller 240 described with reference to FIGS. 1 and 2. Memory controller 505 may include or be coupled with biasing circuitry 510, timing component 515, and condition component 520 and may operate memory apparatus 500 as described with reference to FIGS. 1 through 4.

Memory controller 505 may also include or be coupled with sense component 535, which may sense (e.g., during a read operation) a logic state stored at memory cell 540. Memory controller 505 may be in electronic communication with word line 525, digit line 530, sense component 535, and memory cell 540, which may be examples of a word line, digit line, sense component, and memory cell described with reference to FIGS. 1 through 3. The components of memory apparatus 500 may be in electronic communication with one another and may be configured to perform the functions described with reference to FIGS. 1 through 4.

Memory controller may be operable to implement the techniques described herein by activating word line 525 or digit line 530 (e.g., by applying voltages or currents to word line 525 or digit line 530). For example, biasing circuitry 510 may be configured to apply a voltage or current to operate memory cell 540 to read, write, or refresh memory cell 540. In some cases, memory controller 505 may include a row decoder, column decoder, or both, as described with reference to FIG. 2. This may enable memory controller 505 to access one or more memory cells 540. Biasing circuitry 510 may also provide voltages to operate sense component 535. In some cases, memory controller 505 may perform its operations using timing component 515. For example, timing component 515 may control the timing of the various word line or digit line selections, including timing for voltage and current application to perform the memory functions, such as reading, writing, and refreshing discussed herein. In some cases, timing component 515 may control the operations of biasing circuitry 510.

Memory controller 505 may control the components of memory apparatus 500 so that memory apparatus 500 performs the threshold voltage restoration techniques described herein. For example, memory apparatus 500 may perform a write operation on the memory cell 540 to store a logic state at the memory cell 540. Memory apparatus 500 may also perform a read operation having a first duration (e.g., duration 430-*a*) on the memory cell 540. In some cases, memory apparatus 500 may determine to refresh the memory cell 540 based at least in part on detecting a condition indicating to refresh the memory cell 540. Memory apparatus 500 may perform, based on detecting the condition to refresh the memory cell 540, a read refresh operation having a second duration (e.g., 430-*b*) longer than the first duration on the memory cell 540. In some examples, the duration of the write operation is longer than the second duration of the read refresh operation.

In some examples, the condition may be detected by condition component 520. In one example, detecting the condition may include determining that a threshold amount of time has elapsed since the last write operation or read refresh operation was performed. As noted, the threshold voltage of a memory cell may increase over time due to drift. Accordingly, memory controller 505 may trigger a read refresh operation based on the amount of time that has elapsed since the memory cell 540 was refreshed or written.

In another example, detecting the condition may include determining that a threshold quantity of read operations have been performed since the last write operation or read refresh operation was performed. As noted, the threshold voltage of a memory cell may increase over time due to disturbs that occur when the memory cell is read. Accordingly, memory controller 505 may trigger a read refresh operation based on the quantity of read operations performed on the memory cell 540 since the memory cell 540 was refreshed or written.

In another example, detecting the condition may include determining that a bit error rate for a portion of memory including the memory cell exceeds a threshold bit error rate. As noted, a change in threshold voltage may result in errors in data read during a read operation. This means that more errors will occur as the threshold voltages of memory cells in a region of memory vary (e.g., due to drift or disturb). Accordingly, the memory controller 505 may trigger a read refresh operation based on a bit error rate associated with the region of memory (e.g., a set of memory cells, a deck, stack, array, etc.) that includes the memory cell.

In another example, detecting the condition may include determining that a command to refresh the memory cell has been received from another component. In such an example, the component that decides to perform the read refresh operation may be a component other than memory controller 505 (e.g., the device may be a host device). Thus, the memory controller 505 may trigger a read refresh operation based on receipt of a command that instructs the memory controller 505 to perform a read refresh operation on the memory cell 540 or a region or memory that includes the memory cell 530. In some cases, the decision-making component may send the read refresh command to memory apparatus 500 in response to information received from the memory controller 505. In one example, the information may be information about the amount of time that has elapsed since the memory cell 540 was last written or refreshed. In another example, the information may be information about the quantity of reads performed on the memory cell 540 since it was last written or refreshed. In another example, the information may be information about a bit error rate (e.g., an RBER) associated with a region of memory that includes the memory cell 540.

In some examples, the apparatus 500 may reduce the threshold voltage of the memory cell 540 during a first refresh phase of the read operation. Additionally, the memory apparatus 500 may reduce the threshold voltage of the memory cell during a second refresh phase of the read refresh operation. The second refresh phase may be longer than the first refresh phase (e.g., the duration of the second refresh phase may be duration 415-*b* and the duration of the first refresh phase may be duration 415-*a*).

In some examples, the memory apparatus 500 may reduce the threshold voltage of a selection device (e.g., a selection component 335) coupled with the memory cell 540 during a third refresh phase of the read operation. Additionally, the memory apparatus 500 may reduce the threshold voltage of the selection device during a fourth refresh phase of the read refresh operation. The fourth refresh phase may be longer than the third refresh phase (e.g., the duration of the fourth refresh phase may be duration 420-*b* and the duration of the third refresh phase may be duration 420-*a*).

In some examples, the memory apparatus 500 may sense (e.g., using sense component 535) the logic state stored at the memory cell 540 during a first sensing phase of the read operation (e.g., during duration 410-*a*). Additionally, the memory apparatus 500 may sense the logic state stored at the memory cell 540 during a second sensing phase of the read refresh operation (e.g., during duration 410-*b*). The second sensing phase having a substantially same duration (e.g., duration 410) as the first sensing phase (e.g., to avoid unnecessary power consumption and increased latency).

In some examples, the memory apparatus 500 may apply (e.g., using biasing circuitry 510), for a third duration (e.g., duration 415-*a*), a first current pulse that modifies a threshold voltage of the memory cell 540. In some cases, the first current pulse may reduce the threshold voltage of the memory cell 540. Additionally, the memory apparatus 500 may apply (e.g., using biasing circuitry 510), for a fourth duration (e.g., duration 415-*b*) longer than the third duration, a second current pulse that modifies the threshold voltage of the memory cell 540. In some cases, the second current pulse may reduce the threshold voltage of the memory cell 540 by a greater extent than the first current pulse. In some examples, the memory apparatus 500 may maintain, after applying the first current pulse and for a fifth duration (e.g., duration 420-*a*), a current level that modifies a threshold voltage of a selection device coupled with the memory cell 540. Additionally, the memory apparatus 500 may maintain, after applying the second current pulse and for a sixth duration (e.g., duration 420-*b*) longer than the fifth duration, a current level that modifies the threshold voltage of the selection device. In some examples, the modification of the threshold voltages is a decrease in the threshold voltages.

In some examples, the memory apparatus 500 may apply (e.g., using biasing circuitry 510) a first voltage or a first current to the memory cell 540 to perform the read operation. Additionally, the memory apparatus 500 may apply to the memory cell 540 a second voltage or second current higher than the first voltage or first current to perform the read refresh operation. For example, the amplitude of current waveform 405-*b* may be higher than the amplitude of current waveform 405-*a* during corresponding phases of the read and long refresh operations.

In some examples, the memory apparatus 500 may perform a second read refresh operation on a second memory cell that is in a different memory deck than the memory cell 540. The second read refresh operation may have a third duration longer than the first duration and different than the second duration. Thus, the memory apparatus 500 may use read refresh operations with different durations on different decks of a memory array. In some examples, the memory apparatus 500 may determine the third duration based on identifying the memory deck that includes the second memory cell (e.g., so that the memory apparatus 500 can retrieve the duration from fuses/memory associated with the memory deck). In such cases, performing the second read refresh operation having the third duration may be based at least in part on determining the third duration.

In some examples, the memory apparatus 500 may perform the techniques described herein by applying a first current sequence (e.g., current waveform 405-a) to the memory cell 540 to perform a read operation on the memory cell 540; determining that a condition for refreshing the memory cell 540 has been satisfied; and applying, based on determining that the condition for refreshing the memory cell 540 has been satisfied, a second current sequence (e.g., current waveform 405-b) to the memory cell 540 to perform a read refresh operation on the memory cell 540. The second current sequence may have a duration (e.g., duration 430-b) longer than a duration (e.g., duration 430-a) of the first current sequence.

In some examples, the memory apparatus 500 may apply, as part of the first current sequence, a first pulse of current to the memory cell 540 after sensing a state of the memory cell 540. Additionally, the memory apparatus 500 may apply, as part of the second current sequence, a second pulse of current to the memory cell 540 after sensing the state of the memory cell 540. The second pulse of current may have a longer duration than the first pulse of current.

In some examples, the memory apparatus 500 may maintain (e.g., during duration 415-a), after the first pulse of current and as part of the first current sequence, the current applied to the memory cell 540 at a level within a threshold level (e.g., current level 12) for a first duration (e.g., duration 415-a). Additionally, memory apparatus 500 may maintain, after the second pulse of current and as part of the second current sequence, the current applied to the memory cell 50 at a level within a threshold level (e.g., current level 12) for a second duration (e.g., duration 415-b) longer than the first duration.

In some examples, the memory apparatus 500 may decrease, as part of the first current sequence and for a first duration (e.g., duration 425-a), the current applied to the memory cell 540 to de-select the memory cell 540. Additionally, the memory apparatus 500 may decrease, as part of the second current sequence and for a second duration (e.g., duration 425-b), the current applied to the memory cell 540 to de-select the memory cell 540. The second duration may be substantially equal to the first duration (e.g., to avoid unnecessary power consumption and increased latency).

In some examples, the memory apparatus 500 may apply, as part of the first current sequence, a third pulse of current to select the memory cell for sensing. Additionally, the memory apparatus 500 may apply, as part of the second current sequence, a fourth pulse of current to select the memory cell for sensing, where the third pulse of current and the fourth pulse of current have substantially the same duration (e.g., duration 410).

In some examples, the memory apparatus 500 may apply, to a second memory cell in a different memory deck than the memory cell 540, a third current sequence to perform a read refresh operation on the second memory cell. The third current sequence may have a duration longer than the duration of the first current sequence and different than the duration of the second current sequence (e.g., the duration may be different than duration 430-a and duration 430-b).

In some examples, the memory apparatus 500 may determine that the condition for refreshing the memory cell has been satisfied by receiving a command to refresh the memory cell, detecting that a threshold quantity of reads have been performed, detecting a threshold bit error rate has been exceeded, or determining that a threshold amount of time has elapsed since a last refresh operation or write operation.

In some examples, the memory apparatus 500 may perform the techniques described herein by performing a write operation on a memory cell 540 to store data at the memory cell 540; determining to refresh the memory cell 540 based at least in part on detecting a condition indicating to refresh the memory cell 540; and performing a read refresh operation on the memory cell 540 based on determining to refresh the memory cell 540, where the read refresh operation has a duration longer than a duration of a read operation.

In some examples, the memory apparatus 500 may perform the read operation on the memory cell 540 or a second memory cell. In some examples, the memory apparatus 500 may modify a threshold voltage of the memory cell 540 during a refresh phase of the read refresh operation, where the refresh phase of the read operation is longer than a refresh phase of the read operation.

In some examples, the memory apparatus 500 may modify a threshold voltage of a selection device coupled with the memory cell 540 during a subsequent refresh phase of the read refresh operation, where the subsequent refresh phase is longer than a subsequent refresh phase of the read operation.

In some examples, the memory apparatus 500 may apply, as part of the refresh phase of the read refresh operation, a current pulse that has a longer duration than a current pulse of the refresh phase of the read operation.

In some examples, the memory apparatus 500 may sense the memory cell 540 during a sensing phase of the read refresh operation that is prior to the refresh phase, where the sensing phase has a duration substantially equal to a duration of a sensing phase of the read operation. In some examples, the memory apparatus 500 may deselect the memory cell 540 during a deselection phase that is substantially the same duration as a deselection phase of the read operation.

Figure 6:
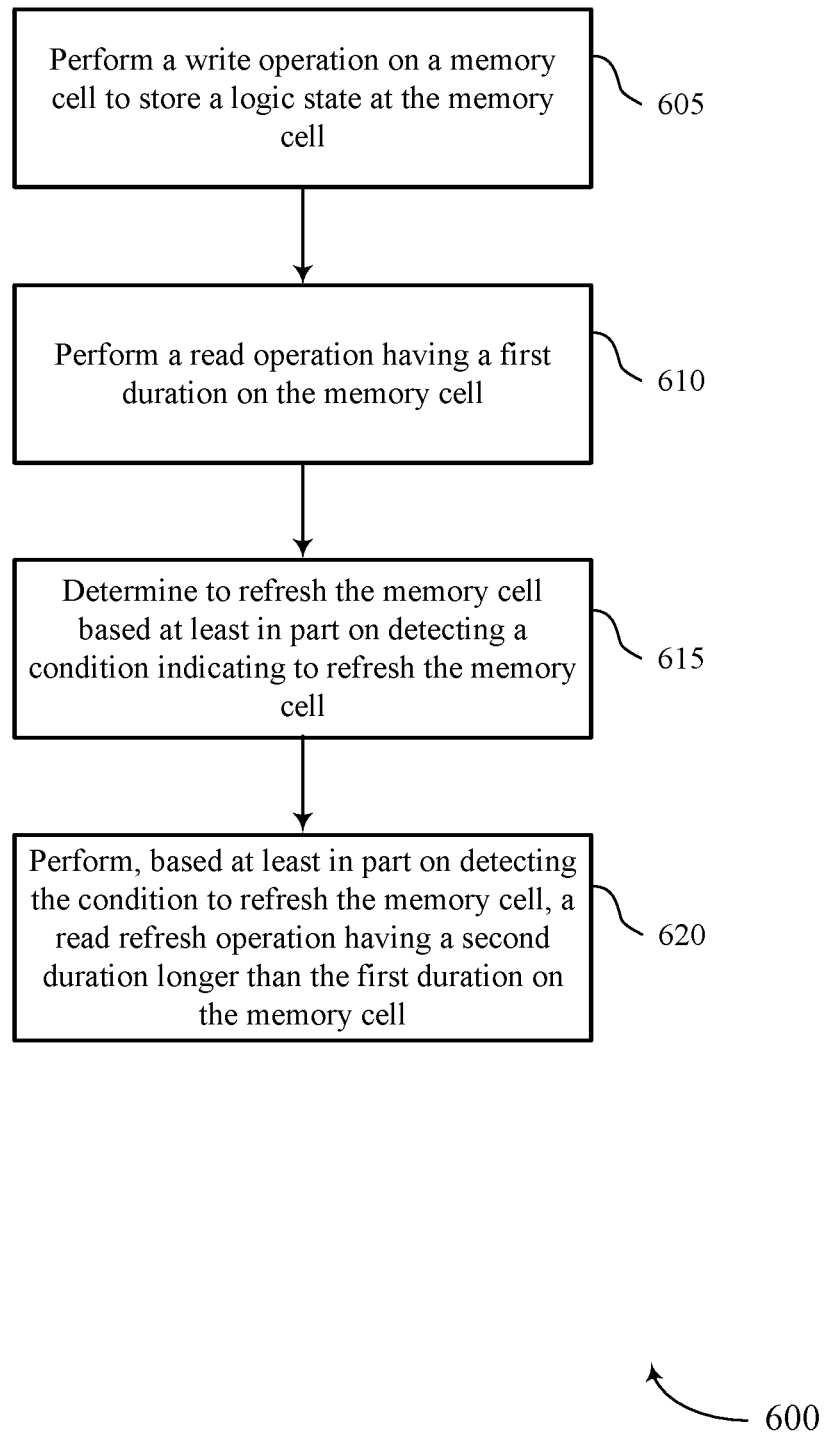
FIGS. 6 through 8 show flowcharts illustrating a method or methods that supports restoring memory cell threshold voltages in accordance with examples as disclosed herein.

FIG. 6 shows a flowchart illustrating a method or methods 600 that supports restoring memory cell threshold voltages in accordance with examples as disclosed herein. The operations of method 600 may be implemented by a memory device or its components as described herein. In some examples, a memory device may execute a set of instructions to control the functional elements of the memory device to perform the described functions. Additionally or alternatively, a memory device may perform aspects of the described functions using special-purpose hardware.

At 605, the method may include performing a write operation on a memory cell to store a logic state at the memory cell. The operations of 605 may be performed according to the methods described herein. The operations of 605 may be performed by a system 100, memory die 200, memory array 300, or memory apparatus 500 as described with reference to FIGS. 1 through 3 and 5, respectively.

At 610, the method may include performing a read operation (e.g., a read operation implemented via current waveform 405-a) having a first duration (e.g., duration 430-a) on the memory cell. The operations of 610 may be performed according to the methods described herein. In some examples, aspects of the operations of 610 may be performed by a system 100, memory die 200, memory array 300, or memory apparatus 500 as described with reference to FIGS. 1 through 3 and 5, respectively.

At 615, the method may include determining to refresh the memory cell based at least in part on detecting a condition indicating to refresh the memory cell. The operations of 615 may be performed according to the methods described herein. In some examples, aspects of the operations of 615 may be performed by a condition component as described with reference to FIG. 5.

At 620, the method may include performing, based at least in part on detecting the condition to refresh the memory cell, a read refresh operation (e.g., a long refresh operation implemented via current waveform 405-b) having a second duration (e.g., duration 430-b) longer than the first duration on the memory cell. The operations of 620 may be performed according to the methods described herein. In some examples, aspects of the operations of 615 may be performed by a system 100, memory die 200, memory array 300, or memory apparatus 500 as described with reference to FIGS. 1 through 3 and 5, respectively.

In some examples, an apparatus as described herein may perform a method or methods, such as the method 600. The apparatus may include features, means, or instructions (e.g., a non-transitory computer-readable medium storing instructions executable by a processor) for performing a write operation on a memory cell to store a logic state at the memory cell; performing a read operation having a first duration on the memory cell; determining to refresh the memory cell based at least in part on detecting a condition indicating to refresh the memory cell; and performing, based at least in part on detecting the condition to refresh the memory cell, a read refresh operation having a second duration longer than the first duration on the memory cell.

Some examples of the method 600 and the apparatus described herein may further include operations, features, means, or instructions for reducing a threshold voltage of the memory cell during a first refresh phase (e.g., the first refresh phase occurring during duration 415-a) of the read operation and reducing the threshold voltage of the memory cell during a second refresh phase (e.g., the first refresh phase occurring during duration 415-b) of the read refresh operation, the second refresh phase longer than the first refresh phase.

Some examples of the method 600 and the apparatus described herein may further include operations, features, means, or instructions for reducing a threshold voltage of a selection device (e.g., a selection component 335) coupled with the memory cell during a third refresh phase (e.g., the second refresh phase occurring during duration 420-a) of the read operation and reducing the threshold voltage of the selection device during a fourth refresh phase (e.g., the second refresh phase occurring during duration 420-b) of the read refresh operation, the fourth refresh phase longer than the third refresh phase.

Some examples of the method 600 and the apparatus described herein may further include operations, features, means, or instructions for sensing the logic state stored at the memory cell during a first sensing phase (e.g., the sensing phase occurring during duration 410-a) of the read operation and sensing the logic state stored at the memory cell during a second sensing phase (e.g., the sensing phase occurring during duration 410-b) of the read refresh operation, the second sensing phase having a substantially same duration as the first sensing phase.

Some examples of the method 600 and the apparatus described herein may further include operations, features, means, or instructions for applying, for a third duration (e.g., duration 415-a), a first current pulse that modifies a threshold voltage of the memory cell and applying, for a fourth duration (e.g., duration 415-b) longer than the third duration, a second current pulse that modifies the threshold voltage of the memory cell. Some examples of the method 600 and the apparatus described herein may further include operations, features, means, or instructions for 1) maintaining, after applying the first current pulse and for a fifth duration (e.g., duration 420-a), a current level that modifies a threshold voltage of a selection device (e.g., a selection component 335) coupled with the memory cell, and 2) maintaining, after applying the second current pulse and for a sixth duration (e.g., duration 420-b) longer than the fifth duration, a current level that modifies the threshold voltage of the selection device.

Some examples of the method 600 and the apparatus described herein may further include operations, features, means, or instructions for determining that a command to refresh the memory cell has been received. Some examples of the method 600 and the apparatus described herein may further include operations, features, means, or instructions for determining that a threshold amount of time has elapsed since the write operation was performed or a last read refresh operation was performed. Some examples of the method 600 and the apparatus described herein may further include operations, features, means, or instructions for determining that a threshold quantity of read operations have been performed since the write operation was performed or a last read refresh operation was performed. Some examples of the method 600 and the apparatus described herein may further include operations, features, means, or instructions for determining that a bit error rate for a portion of memory including the memory cell exceeds a threshold bit error rate.

Some examples of the method 600 and the apparatus described herein may further include operations, features, means, or instructions for applying a first voltage to the memory cell to perform the read operation and applying a second voltage higher than the first voltage to the memory cell to perform the read refresh operation. Some examples of the method 600 and the apparatus described herein may further include operations, features, means, or instructions for applying a first current to the memory cell to perform the read operation and applying a second current higher than the first current to the memory cell to perform the read refresh operation.

Some examples of the method 600 and the apparatus described herein may further include operations, features, means, or instructions for performing a second read refresh operation on a second memory cell in a different memory deck than the memory cell, the second read refresh operation having a third duration longer than the first duration and different than the second duration. Some examples of the method 600 and the apparatus described herein may further include operations, features, means, or instructions for determining the third duration based at least in part on identifying the memory deck that includes the second memory cell, wherein performing the second read refresh operation having the third duration is based at least in part on determining the third duration.

In some examples of the method 600 and the apparatus described herein, a duration of the write operation is longer than the second duration (e.g., duration 430-b) of the read refresh operation.

Figure 7:
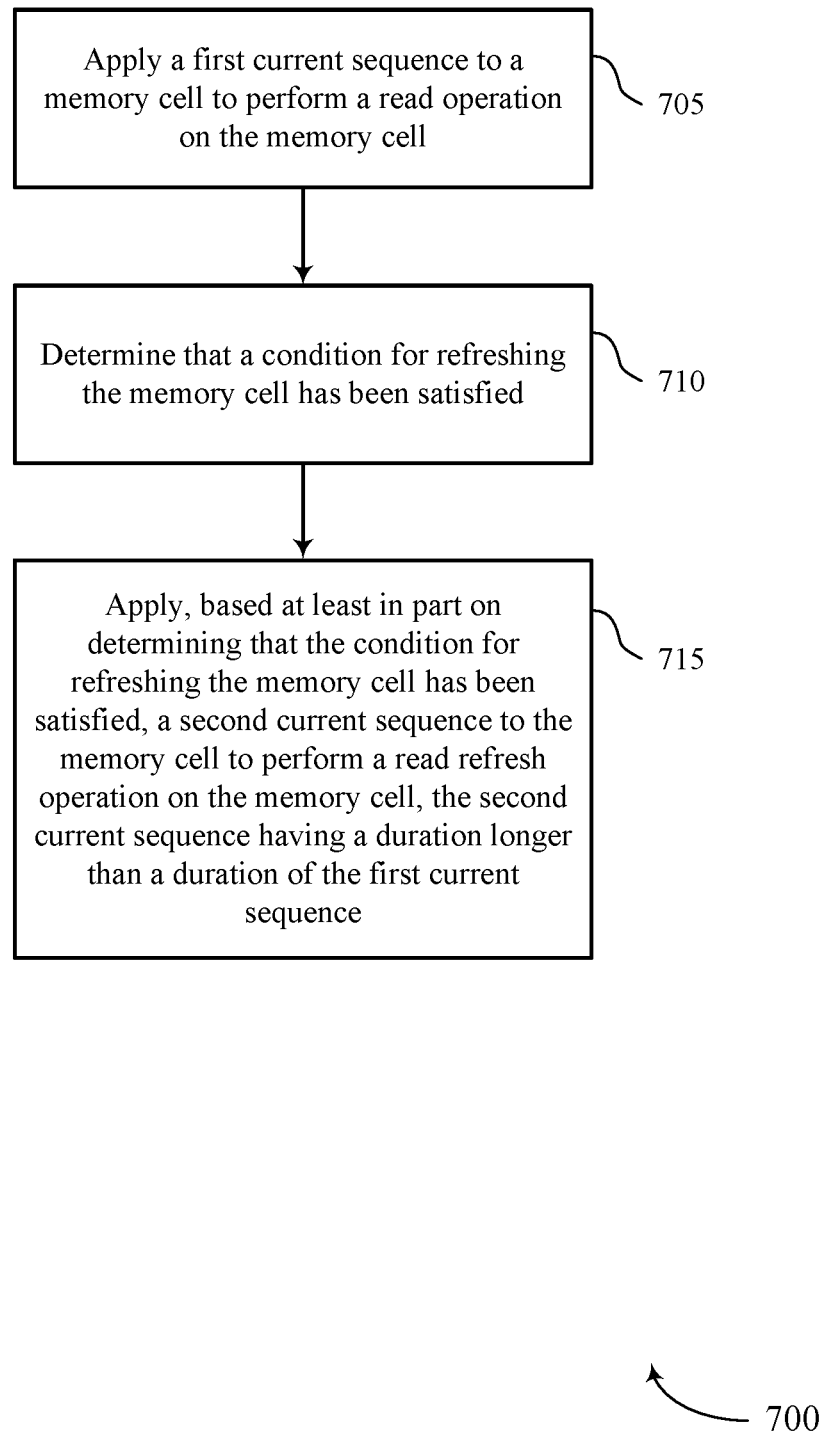

FIG. 7 shows a flowchart illustrating a method or methods 700 that supports restoring memory cell threshold voltages in accordance with examples as disclosed herein. The operations of method 700 may be implemented by a memory device or its components as described herein. In some examples, a memory device may execute a set of instructions to control the functional elements of the memory device to perform the described functions. Additionally or alternatively, a memory device may perform aspects of the described functions using special-purpose hardware.

At 705, the method may include applying a first current sequence (e.g., current waveform 405-a) to a memory cell to perform a read operation on the memory cell. The operations of 705 may be performed according to the methods described herein. The operations of 705 may be performed by biasing circuitry as described with reference to FIG. 5.

At 710, the method may include determining that a condition for refreshing the memory cell has been satisfied. The operations of 710 may be performed according to the methods described herein. In some examples, aspects of the operations of 710 may be performed by a condition component as described with reference to FIG. 5.

At 715, the method may include applying, based at least in part on determining that the condition for refreshing the memory cell has been satisfied, a second current sequence (e.g., current waveform 405-b) to the memory cell to perform a read refresh operation on the memory cell, the second current sequence having a duration (e.g., duration 430-b) longer than a duration (e.g., duration 430-a) of the first current sequence. The operations of 715 may be performed according to the methods described herein. In some examples, aspects of the operations of 715 may be performed by biasing circuitry as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for applying a first current sequence (e.g., current waveform 405-a) to a memory cell to perform a read operation on the memory cell; determining that a condition for refreshing the memory cell has been satisfied; and applying, based at least in part on determining that the condition for refreshing the memory cell has been satisfied, a second current sequence (e.g., current waveform 405-b) to the memory cell to perform a read refresh operation on the memory cell, the second current sequence having a duration longer than a duration of the first current sequence.

Some examples of the method 700 and the apparatus described herein may further include operations, features, means, or instructions for applying, as part of the first current sequence, a first pulse of current (e.g., during duration 415-a) to the memory cell after sensing a state of the memory cell and applying, as part of the second current sequence, a second pulse of current (e.g., during duration 415-b) to the memory cell after sensing the state of the memory cell, where the second pulse of current has a longer duration than the first pulse of current.

Some examples of the method 700 and the apparatus described herein may further include operations, features, means, or instructions for maintaining, after the first pulse of current and as part of the first current sequence, the current applied to the memory cell at a level within a threshold level for a first duration (e.g., duration 420-a) and maintaining, after the second pulse of current and as part of the second current sequence, the current applied to the memory cell at a level within a threshold level for a second duration (e.g., 420-b) longer than the first duration.

Some examples of the method 700 and the apparatus described herein may further include operations, features, means, or instructions for decreasing, as part of the first current sequence and for a first duration (e.g., duration 425-a), the current applied to the memory cell to de-select the memory cell and decreasing, as part of the second current sequence and for a second duration (e.g., duration 425-b), the current applied to the memory cell to de-select the memory cell, wherein the second duration is substantially equal to the first duration.

Some examples of the method 700 and the apparatus described herein may further include operations, features, means, or instructions for applying, as part of the first current sequence, a third pulse of current (e.g., during duration 410-a) to select the memory cell for sensing and applying, as part of the second current sequence, a fourth pulse of current (e.g., during duration 410-b) to select the memory cell for sensing, wherein the third pulse of current and the fourth pulse of current have substantially the same duration.

Some examples of the method 700 and the apparatus described herein may further include operations, features, means, or instructions for applying, to a second memory cell in a different memory deck than the memory cell, a third current sequence to perform a read refresh operation on the second memory cell, the third current sequence having a duration longer than the duration of the first current sequence and different than the duration of the second current sequence.

Some examples of the method 700 and the apparatus described herein may further include operations, features, means, or instructions for receiving a command to refresh the memory cell, detecting that a threshold quantity of reads have been performed, detecting a threshold bit error rate has been exceeded, or determining that a threshold amount of time has elapsed since a last refresh operation or write operation.

Figure 8:
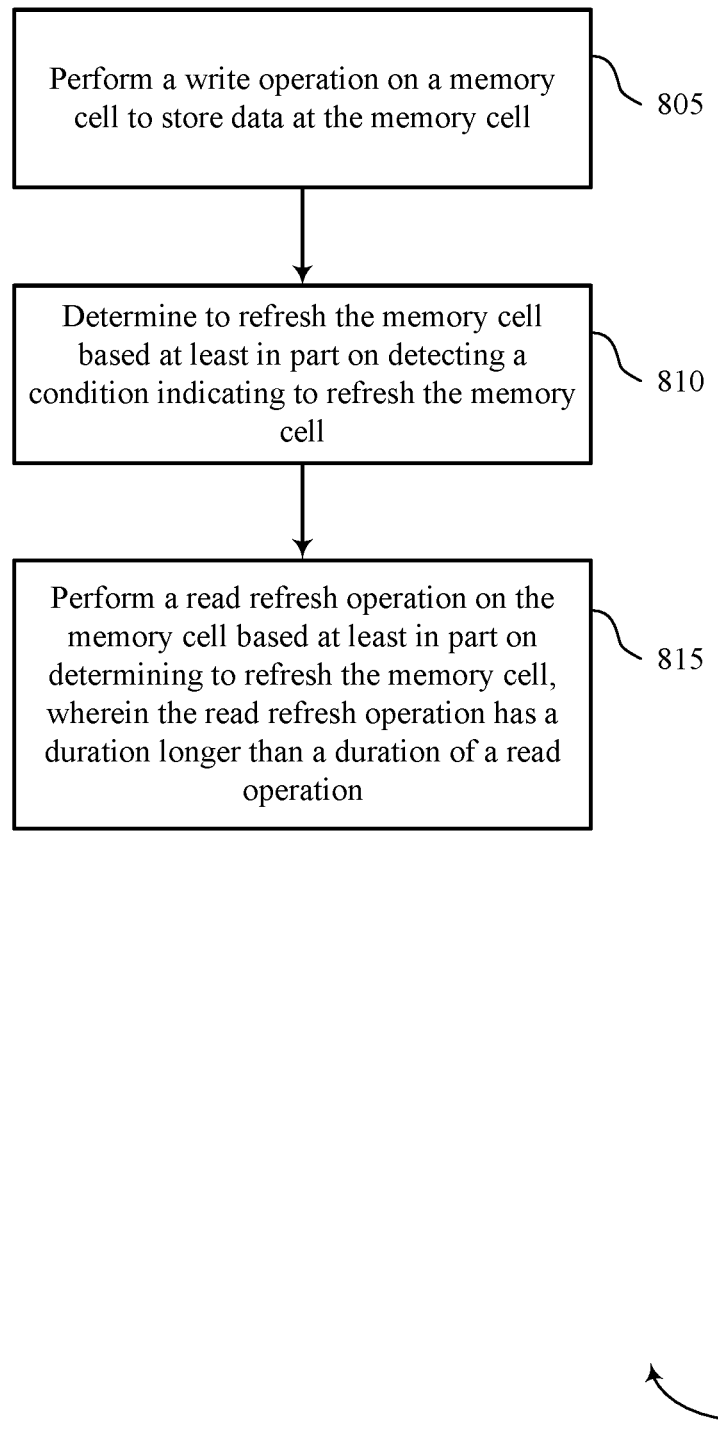

FIG. 8 shows a flowchart illustrating a method or methods 800 that supports restoring memory cell threshold voltages in accordance with examples as disclosed herein. The operations of method 800 may be implemented by a memory device or its components as described herein. In some examples, a memory device may execute a set of instructions to control the functional elements of the memory device to perform the described functions. Additionally or alternatively, a memory device may perform aspects of the described functions using special-purpose hardware.

At 805, the method may include performing a write operation on a memory cell to store data at the memory cell. The operations of 805 may be performed according to the methods described herein. The operations of 805 may be performed by a system 100, memory die 200, memory array 300, or memory apparatus 500 as described with reference to FIGS. 1 through 3 and 5, respectively.

At 810, the method may include determining to refresh the memory cell based at least in part on detecting a condition indicating to refresh the memory cell. The operations of 810 may be performed according to the methods described herein. In some examples, aspects of the operations of 810 may be performed by a condition component as described with reference to FIG. 5.

At 815, the method may include applying, performing a read refresh operation (e.g., a long refresh operation implemented by current waveform 405-b) on the memory cell based at least in part on determining to refresh the memory cell, wherein the read refresh operation has a duration (e.g., duration 430-b) longer than a duration (e.g., duration 430-a)

of a read operation. The operations of 815 may be performed according to the methods described herein. In some examples, aspects of the operations of 815 may be performed by biasing circuitry as described with reference to FIG. 5.

In some examples, an apparatus as described herein may perform a method or methods, such as the method 800. The apparatus may include features, means, or instructions (e.g., a non-transitory computer-readable medium storing instructions executable by a processor) for performing a write operation on a memory cell to store data at the memory cell; determining to refresh the memory cell based at least in part on detecting a condition indicating to refresh the memory cell; and performing a read refresh operation (e.g., a long refresh operation) on the memory cell based at least in part on determining to refresh the memory cell, wherein the read refresh operation has a duration longer than a duration of a read operation.

Some examples of the method 800 and the apparatus described herein may further include operations, features, means, or instructions for performing the read operation on the memory cell or a second memory cell and modifying a threshold voltage of the memory cell during a refresh phase (e.g., a first refresh phase occurring during duration 410-*a*) of the read refresh operation, wherein the refresh phase of the read operation is longer than a refresh phase (e.g., a second refresh phase occurring during duration 410-*b*) of the read operation.

Some examples of the method 800 and the apparatus described herein may further include operations, features, means, or instructions for applying, as part of the refresh phase of the read refresh operation, a current pulse that has a longer duration than a current pulse of the refresh phase of the read operation.

Some examples of the method 800 and the apparatus described herein may further include operations, features, means, or instructions for sensing the memory cell during a sensing phase of the read refresh operation that is prior to the refresh phase, wherein the sensing phase has a duration substantially equal to a duration of a sensing phase of the read operation.

Some examples of the method 800 and the apparatus described herein may further include operations, features, means, or instructions for deselecting the memory cell during a deselection phase (e.g., a deselection phase occurring during duration 425-*b*) that is substantially the same duration as a deselection phase (e.g., a deselection phase occurring during duration 425-*a*) of the read operation.

It should be noted that the methods described herein are possible implementations, and that the operations and the steps may be rearranged or otherwise modified and that other implementations are possible. Furthermore, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together (e.g., coupled component A with component B, or coupled component A to component B), the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
performing a read operation on a memory cell by applying, to the memory cell for a first duration, a first continuous current sequence that includes a first peaking pulse followed by a first rectangular pulse; and
performing, after the read operation, a read refresh operation on the memory cell by applying, to the memory cell for a second duration longer than the first duration, a second continuous current sequence that includes a second peaking pulse followed by a second rectangular pulse.

2. The method of claim 1, wherein the memory cell is a phase change memory cell and wherein the read refresh operation modifies a threshold voltage of the phase change memory cell.

3. The method of claim 1, wherein a duration of the second rectangular pulse of the second continuous current sequence is longer than a duration of the first rectangular pulse of the first continuous current sequence.

4. The method of claim 3, wherein a duration of the second peaking pulse of the second continuous current sequence is equal to a duration of the first peaking pulse of the first continuous current sequence.

5. The method of claim 1, wherein a magnitude of the first peaking pulse is greater than a magnitude of the first rectangular pulse, and a magnitude of the second peaking pulse is greater than a magnitude of the second rectangular pulse.

6. The method of claim 5, wherein the first continuous current sequence is maintained, after the first rectangular pulse, at a level below a magnitude of the first rectangular pulse for a third duration, and wherein the second continuous current sequence is maintained, after the second rectangular pulse, at a level below a magnitude of the second rectangular pulse for a fourth duration longer than the third duration.

7. The method of claim 1, wherein the first peaking pulse of the first continuous current sequence is followed by the first rectangular pulse after a third duration, and the second peaking pulse of the second continuous current sequence is followed by the second rectangular pulse after a fourth duration equal to the third duration.

8. The method of claim 1, wherein a magnitude of the second peaking pulse of the second continuous current sequence is greater than a magnitude of the first peaking pulse of the first continuous current sequence.

9. The method of claim 1, further comprising:
ramping down the first continuous current sequence to a threshold level after the first rectangular pulse and for a third duration; and
ramping down the second continuous current sequence to the threshold level after the second rectangular pulse and for a fourth duration equal to the third duration.

10. The method of claim 1, wherein the memory cell is in a first memory deck, the method further comprising:
performing a second read refresh operation on a second memory cell in a second memory deck by applying, to the second memory cell, a third continuous current sequence for a third duration that is longer than the first duration and that is different than the second duration.

11. The method of claim 1, further comprising:
determining that a threshold quantity of read operations has been performed since a previous read refresh operation was performed, wherein the read refresh operation is performed based at least in part on the determination.

12. The method of claim 1, further comprising:
determining that an error rate for a region of memory including the memory cell exceeds a threshold error rate, wherein the read refresh operation is performed based at least in part on the determination.

13. The method of claim 1, further comprising:
determining that a threshold amount of time has elapsed since a previous read refresh operation was performed, wherein the read refresh operation is performed based at least in part on the determination.

14. A method, comprising:
applying, to a memory cell as part of a read operation, a first continuous current sequence comprising a first peaking pulse having a first duration followed by a first rectangular pulse having a second duration; and
applying, to the memory cell as part of a read refresh operation, a second continuous current sequence comprising a second peaking pulse having the first duration followed by a second rectangular pulse having a third duration longer than the second duration.

15. The method of claim 14, wherein a magnitude of the first peaking pulse is greater than a magnitude of the first rectangular pulse, and a magnitude of the second peaking pulse is greater than a magnitude of the second rectangular pulse.

16. The method of claim 15, wherein the first peaking pulse of the first continuous current sequence is followed by the first rectangular pulse after a fourth duration, and the second peaking pulse of the second continuous current sequence is followed by the second rectangular pulse after a fifth duration equal to the fourth duration.

17. The method of claim 14, wherein the first continuous current sequence is maintained, for a first period of time after the first rectangular pulse, at a first threshold level before being reduced to a second threshold level, and wherein the second continuous current sequence is maintained, after the second rectangular pulse for a second period of time longer than the first period of time, at the first threshold level before being reduced to the second threshold level.

18. The method of claim 14, wherein a magnitude of the second peaking pulse of the second continuous current sequence is equal to a magnitude of the first peaking pulse of the first continuous current sequence.

19. A method, comprising:
determining to perform a read refresh operation on a phase change memory cell that has a threshold voltage; and
performing, based at least in part on the determination, the read refresh operation on the phase change memory cell to modify the threshold voltage, wherein the read refresh operation has a duration longer than a duration of a read operation and comprises a continuous current sequence that includes a peaking pulse followed by a rectangular pulse.

20. The method of claim 19, further comprising:
performing the read operation on the phase change memory cell, wherein the read operation comprises a second continuous current sequence that includes a second peaking pulse followed by a second rectangular pulse, the second peaking pulse having a same duration as the peaking pulse and the second rectangular pulse having a shorter duration than the rectangular pulse.

* * * * *